(12) United States Patent
Joshi (10) Patent No.: US 11,031,318 B2
(45) Date of Patent: *Jun. 8, 2021

(54) ENCAPSULATED PHASE CHANGE POROUS LAYER

(71) Applicant: TOYOTA MOTOR ENGINEERING & MANUFACTURING NORTH AMERICA, INC., Plano, TX (US)

(72) Inventor: Shailesh N. Joshi, Ann Arbor, MI (US)

(73) Assignee: TOYOTA JIDOSHA KABUSHIKI KAISHA, Aichi-Ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/864,383

(22) Filed: May 1, 2020

(65) Prior Publication Data

US 2020/0258811 A1 Aug. 13, 2020

Related U.S. Application Data

(63) Continuation of application No. 16/243,625, filed on Jan. 9, 2019, now Pat. No. 10,679,923.

(51) Int. Cl.
*H01L 23/427* (2006.01)
*H01L 21/48* (2006.01)
(Continued)

(52) U.S. Cl.
CPC .......... *H01L 23/427* (2013.01); *F28F 13/003* (2013.01); *F28F 21/081* (2013.01);
(Continued)

(58) Field of Classification Search
CPC .......... H05K 7/20881; H05K 7/20336; H05K 7/20936; H05K 2201/064; H01L 21/56;
(Continued)

(56) References Cited

U.S. PATENT DOCUMENTS 5,788,912 A * 8/1998 Salyer .................... C04B 28/02
106/18.11
5,984,953 A 11/1999 Sabin et al.
(Continued)

FOREIGN PATENT DOCUMENTS

| CN | 101746712 | 7/2012 |
|---|---|---|
| CN | 103862742 | 10/2015 |
| CN | 105779975 | 7/2016 |

OTHER PUBLICATIONS

Electronics Cooling, Metal Inverse Opals Could Better Cool Electronics (Year: 2016).*

*Primary Examiner* — Zachary Pape
*Assistant Examiner* — Amir A Jalali
(74) *Attorney, Agent, or Firm* — Dinsmore & Shohl LLP (57) ABSTRACT

A cooling device including an encapsulated phase change porous layer that exhibits an increased heat capacity is disclosed. The encapsulated phase change porous layer may include a sintered porous layer, a phase change material formed over the sintered porous layer, and an encapsulation material formed over the phase change material. The encapsulation material may encapsulate the phase change material between the encapsulation material and the sintered porous layer and retain the phase change material between the encapsulation material and the sintered porous layer when a fluid is flowed through or in contact with the encapsulated phase change porous layer.

20 Claims, 5 Drawing Sheets

(51) Int. Cl.
 *H05K 7/20* (2006.01)
 *F28F 13/00* (2006.01)
 *F28F 21/08* (2006.01)

(52) U.S. Cl.
 CPC .......... *F28F 21/084* (2013.01); *F28F 21/085* (2013.01); *F28F 21/087* (2013.01); *H01L 21/4871* (2013.01); *H05K 7/20336* (2013.01); *F28F 2255/18* (2013.01); *H05K 7/20254* (2013.01)

(58) Field of Classification Search
 CPC ... H01L 21/565; H01L 21/48; H01L 21/4846; H01L 21/4871; H01L 23/427; H01L 23/367; H01L 23/4275; H01L 23/567; F28F 13/003; F28F 21/081–087; F28D 20/02; F28D 20/023; C09K 5/063
 USPC .......... 361/700, 704; 165/80.4–80.5, 104.33; 257/715, E23.088
 See application file for complete search history.

(56) References Cited

U.S. PATENT DOCUMENTS

| | | | |
|---|---|---|---|
| 6,848,500 B1 | 2/2005 | Langari et al. | |
| 7,378,701 B2 | 5/2008 | Hideki | |
| 9,501,112 B2 | 11/2016 | Nelson et al. | |
| 10,036,599 B1 | 7/2018 | Strehlow et al. | |
| 10,217,693 B1 | 2/2019 | Ing et al. | |
| 2003/0017101 A1 | 1/2003 | Klett et al. | |
| 2004/0159422 A1* | 8/2004 | Zuo | F28D 20/023 165/104.14 |
| 2012/0196040 A1* | 8/2012 | Wilk, Jr. | C04B 41/61 427/294 |
| 2012/0227926 A1 | 9/2012 | Field et al. | |
| 2013/0298991 A1* | 11/2013 | Parker | C04B 18/021 136/259 |
| 2014/0268572 A1 | 9/2014 | Ranjari et al. | |
| 2014/0285967 A1 | 9/2014 | Wikander et al. | |
| 2016/0049352 A1 | 2/2016 | Dahlstrom | |
| 2016/0319174 A1 | 11/2016 | Razack et al. | |
| 2016/0343639 A1 | 11/2016 | Groothuis et al. | |
| 2017/0075396 A1* | 3/2017 | Damaraju | G06F 1/203 |
| 2017/0181318 A1 | 6/2017 | Soupremanien et al. | |
| 2018/0090415 A1* | 3/2018 | Escobar-Vargas | H01L 25/0657 |
| 2018/0204783 A1* | 7/2018 | Han | H05K 9/0088 |
| 2018/0320984 A1* | 11/2018 | Lewis | F28D 15/0283 |
| 2019/0017751 A1* | 1/2019 | Singh | F28D 15/00 |
| 2019/0085225 A1 | 3/2019 | Zhang et al. | |
| 2019/0288351 A1 | 9/2019 | Son et al. | |
| 2020/0132392 A1* | 4/2020 | Joshi | H05K 7/20318 |
| 2020/0152549 A1* | 5/2020 | Joshi | H01L 21/4875 |

\* cited by examiner

ENCAPSULATED PHASE CHANGE POROUS LAYER

CROSS-REFERENCE TO RELATED APPLICATION

The present application is a continuation of and claims priority to U.S. patent application Ser. No. 16/243,625, filed Jan. 9, 2019 and entitled "ENCAPSULATED PHASE CHANGE POROUS LAYER," which is incorporated by reference herein in its entirety.

BACKGROUND

The present disclosure generally relates to systems and/or methods for increasing the heat capacity of a highly porous layer.

A cooling device may be coupled to a heat generation device to remove heat from the heat generation device in efforts to minimize damage to the heat generation device, to increase functional efficiencies of the heat generation device, and/or the like. Some cooling devices utilize a cooling fluid to absorb heat from a heat-generating device.

A cooling device may include a porous layer to cool a heat generation device. However, due to its network of pores or voids, a porous layer may have a reduced heat capacity. This reduced heat capacity may cause the porous layer to become undesirably hot when the heat generation device operates at a high temperature. Accordingly, a porous layer having an increased heat capacity that is capable of dissipating heat when a heat generation device operates at a high temperature may be desired. A porous layer that is capable of reducing the operating temperature of a heat generation device to an acceptable operating temperature may also be desired.

SUMMARY

In one embodiment, a method of forming an encapsulated phase change porous layer is disclosed. The method may include providing or forming a sintered porous layer, forming a phase change material over the sintered porous layer, and forming an encapsulation material over the phase change material. The encapsulation material may encapsulate the phase change material between the encapsulation material and the sintered porous layer and retain the phase change material between the encapsulation material and the sintered porous layer when a fluid is flowed through or in contact with the encapsulated phase change porous layer. The encapsulated phase change porous layer may be part of a cooling device coupled to a heat generating device to transfer heat away from the heat generation device.

In another embodiment, a cooling device is disclosed. The cooling device may include an encapsulated phase change porous layer having a sintered porous layer, a phase change material formed over the sintered porous layer, and an encapsulation material formed over the phase change material. The encapsulation material may encapsulate the phase change material between the encapsulation material and the sintered porous layer and retain the phase change material between the encapsulation material and the sintered porous layer when a fluid is flowed through or in contact with the encapsulated phase change porous layer. The cooling device may be coupled to a heat generation device to transfer heat away from the heat generation device.

In yet another embodiment, a system including a heat generation device and a cooling device coupled to the heat generation device is disclosed. The cooling device may include an encapsulated phase change porous layer having a sintered porous layer, a phase change material formed over the sintered porous layer, and an encapsulation material formed over the phase change material. The encapsulation material may encapsulate the phase change material between the encapsulation material and the sintered porous layer and retain the phase change material between the encapsulation material and the sintered porous layer when a fluid is flowed through or in contact with the encapsulated phase change porous layer. The cooling device may transfer heat away from the heat generation device of the system.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, wherein like structure is indicated with like reference numerals and in which:

DETAILED DESCRIPTION

The present disclosure relates to a porous layer, a method of producing the porous layer, and systems including the porous layer. According to various embodiments disclosed herein, the porous layer may include an encapsulated phase change material against a metal of the porous layer. According to various aspects, the embedded and encapsulated phase change material increases the heat capacity of the porous layer.

Figure 1A:
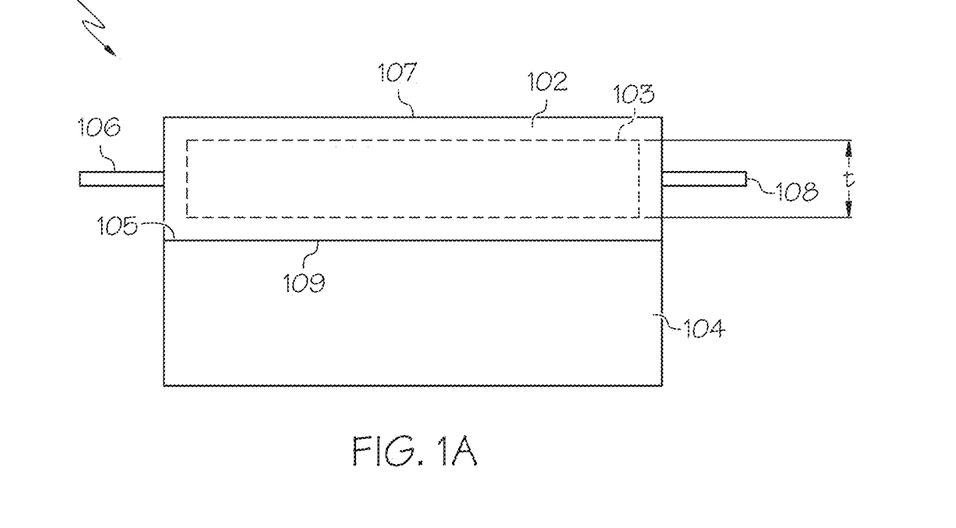
FIG. 1A depicts a simple block diagram of an illustrative heat transfer system, including a cooling device coupled to a heat generation device, according to one or more embodiments shown and described herein.

FIG. 1A depicts a simple block diagram of an illustrative heat transfer system 100 according to various embodiments described herein. In reference to FIG. 1A, the heat transfer system 100 may include a cooling device 102 coupled to (e.g., positioned in contact with) a heat generation device 104. The heat generation device 104 of FIG. 1A is not limited by the present disclosure and may be generally any device that generates heat as a byproduct of operation. In some embodiments, the heat generation device may be a semiconductor device such as, for example, an insulated-gate bipolar transistor (IGBT), a diode, a transistor, an integrated circuit, a silicon-controlled rectifier (SCR), a thyristor, a gate turn-off thyristor (GTO), a triac, a bipolar junction transistor (BJT), a power metal oxide semiconductor field-effect transistor (MOSFET), a MOS-controlled thyristor (MCT), an integrated gate-commutated thyristor (IGCT), and/or the like. Other examples of a heat generation device, not specifically described herein, should generally be understood, and are included within the scope of the present disclosure. The cooling device 102 of FIG. 1A may generally be any device or system that cools via heat transfer. Illustrative examples of devices or systems that cool via heat transfer (e.g., via heat exchange) include, but are not limited to, pool boiling units, heat pipe assemblies, heat spreaders, vapor chambers, thermoelectric cooling devices, thermal diodes, and other heat exchange devices not specifically described herein. Such devices and systems may generally incorporate and/or may be fluidly coupled to a supply tube 106 that directs a cooling fluid into the cooling device 102 and an extract tube 108 that removes heated cooling fluid from the cooling device 102. The supply tube 106 and the extract tube 108 may be fluidly coupled to one or more additional components (not shown) for the purposes of directing and/or recirculating the cooling fluid therethrough.

According to various embodiments described herein, the cooling device 102 of FIG. 1A may include a porous layer 103 as specifically described herein. Such a cooling device 102 may be an active heat management device according to some embodiments. That is, the cooling device 102 may actively draw heat from the heat generation device 104 as a cooling fluid is flowed through the porous layer 103. However, the cooling device 102 may be a passive heat management device in other embodiments. That is, the porous layer 103 itself may act as a device particularly configured to dissipate heat generated by the heat generation device 104 by providing an increased surface area for heat dissipation. As active and passive heat management devices are generally understood, such details are not described further herein.

Figure 1B:
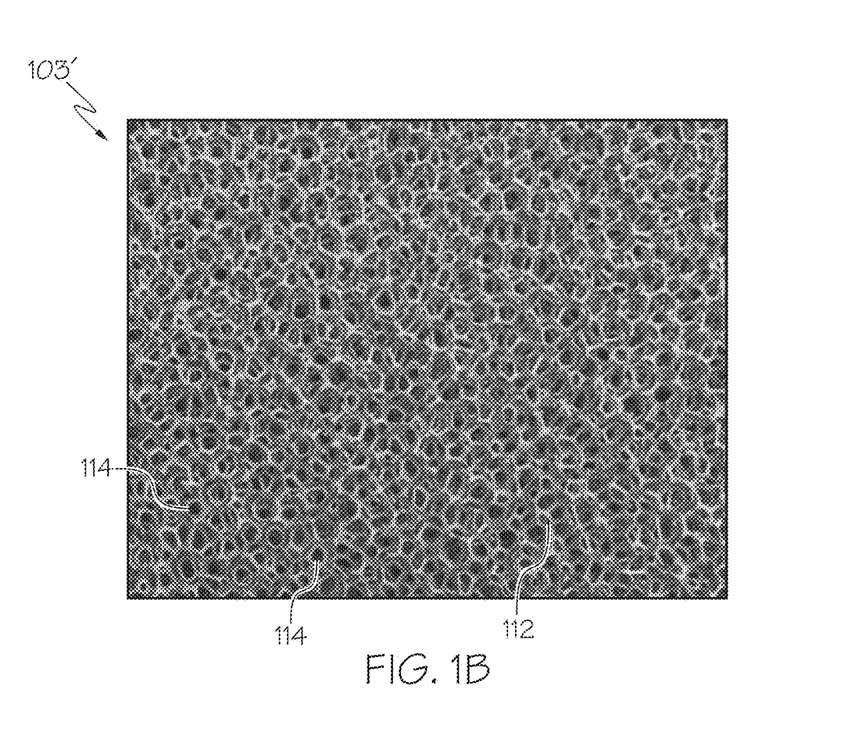
FIG. 1B depicts an illustrative porous layer according to one or more embodiments shown and described herein.

FIG. 1B illustrates an example porous layer 103' formed via a sintering process. In view of FIG. 1B, the porous layer 103' may include a material 112 (e.g., a porous layer material) that defines a network of voids or pores (e.g., referenced generally as 114). According to various aspects, the material 112 that defines the network of voids or pores 114 may include a metal such as Copper (Cu), Nickel (Ni), and/or the like. According to various embodiments described herein, the network of voids or pores 114 provide an increased surface area for nucleation of a cooling liquid from a liquid to a gas (e.g., passive heat management). The network of voids or pores 114 also provide a structure through which a cooling fluid (e.g., liquid and/or gas) may flow to cool the porous layer and the heat generation device coupled thereto (e.g., active heat management).

As introduced, according to various aspects described herein, the porous layer 103' of FIG. 1B may be formed via a sintering process by which material 112 particles or powders (e.g., metals such as Cu, Ni, and/or the like) are sintered at a predefined sintering temperature for a predefined time period to form the porous layer 103' with the network of voids or pores 114. Various sintering processes should generally be understood and are included within the scope of the present disclosure. In view of FIG. 1B, the porous layer 103' may define voids or pores 114 of varying size, varying shape, varying density, and/or varying distribution. Accordingly, the material 112 (e.g., metal) of the porous layer 103' may include varying cross-sectional shapes and/or thicknesses. According to other aspects, the porous layer 103' of FIG. 1B may be formed by other than a sintering process.

Figure 2A:
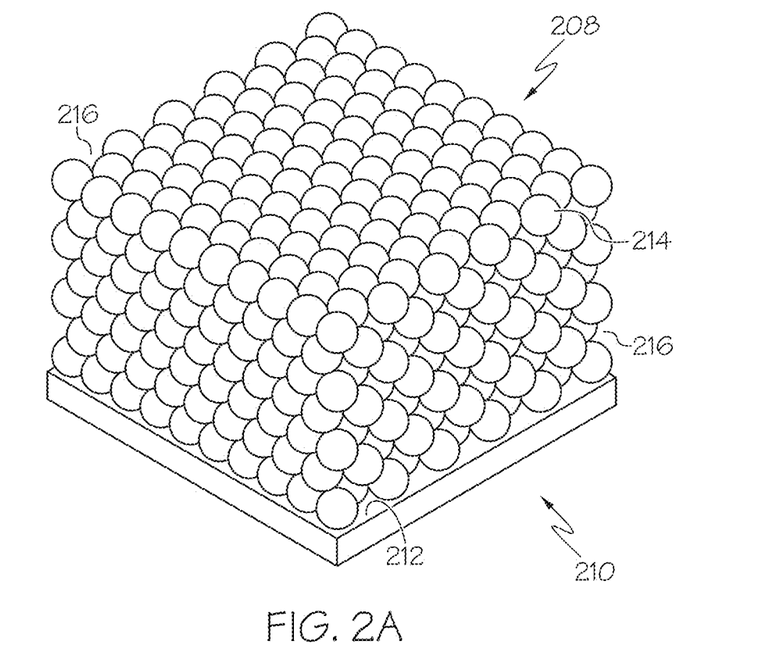
FIG. 2A schematically depicts a perspective view of an opal structure utilized to form a porous layer according to one or more embodiments shown and described herein.
Figure 2B:
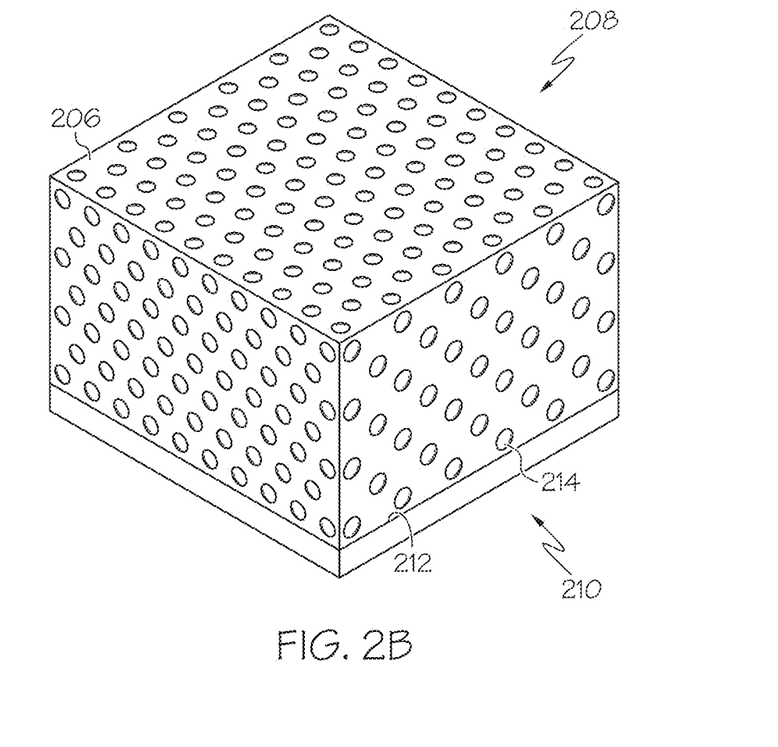
FIG. 2B schematically depicts a material deposited over the opal structure of FIG. 2A according to one or more embodiments shown and described herein.
Figure 2C:
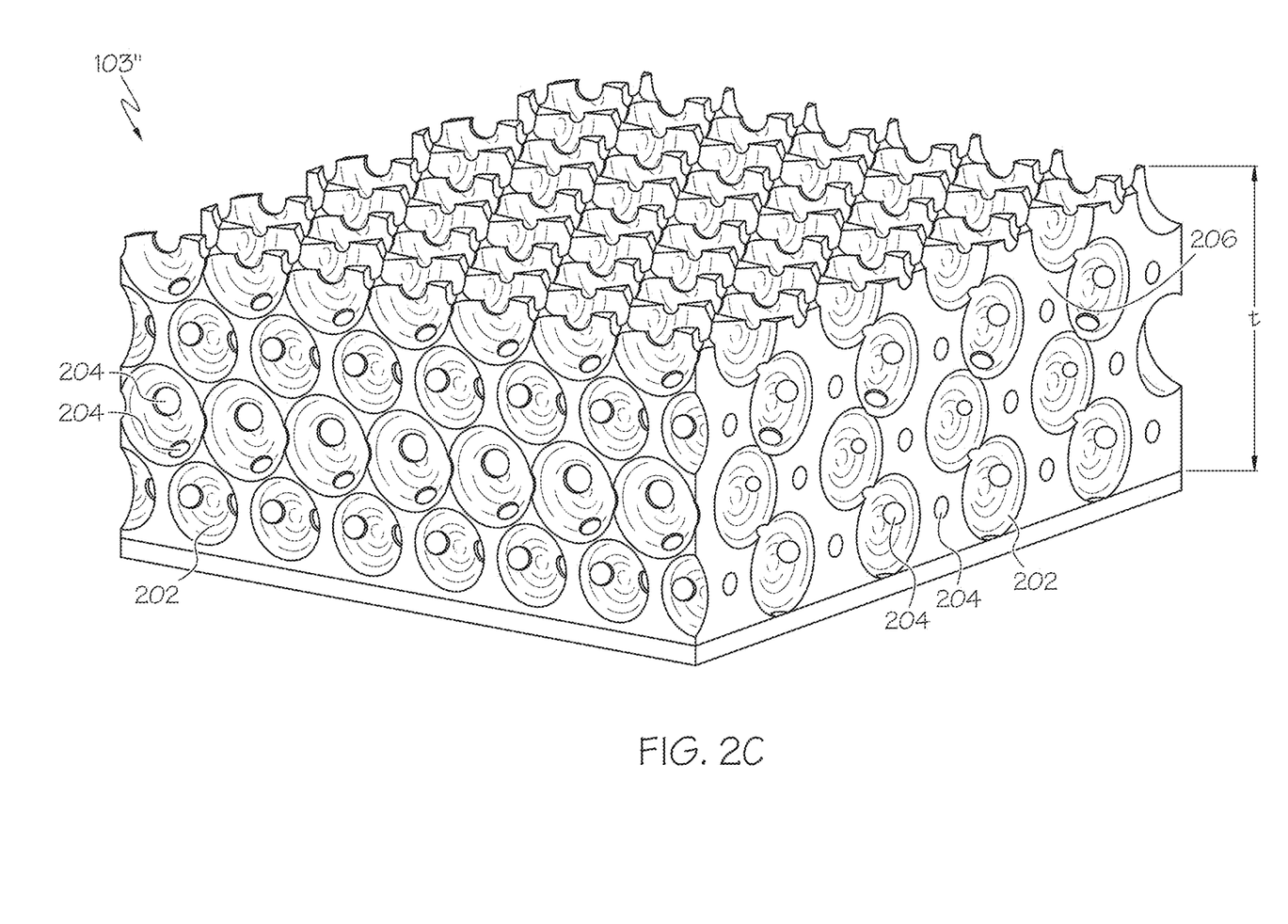
FIG. 2C schematically depicts the material of FIG. 2B after the opal structure of FIG. 2A is removed, thereby forming a porous layer according to one or more embodiments shown and described herein.

Another example porous layer 103" may be formed via a metal inverse opal (MIO) process (e.g., a copper inverse opal process (CIO), a nickel inverse opal (NIO) process, and/or the like). FIGS. 2A-2C illustrate various stages during the formation of the porous layer 103" via a MIO process. FIG. 2C illustrates a resulting porous layer 103" (e.g., MIO structure) formed via the MIO process. The porous layer 103" may have a plurality of dimples 202 (or other similar depression or indentation) and a plurality of pores 204 (e.g., a network of pores 204) such that cooling fluid present within the porous layer 103" can flow through each of the plurality of pores 204 and contact a greater amount of surface area for the purposes of heat transfer to the cooling fluid. It should be understood that inverse opal structures (including MIO structures) have a high permeability as inverse opal wick structures provide the advantage of improved control over pore sizes and distribution. The number of dimples 202, pores 204, and/or other surface features present in the porous layer 103" is not limited by the present disclosure, and may be any number so long as the connectivity between the material 206 (e.g., porous layer material, a thermally conductive material) of the porous layer 103" and a surface or interface of the heat generation device (see FIG. 1A, e.g., surface 109 of heat generation device 104) is maintained. Thus, as fluid flows through the dimples 202, the pores 204, and/or other surface features of the porous layer 103", latent heat is carried away from the material 206 of the porous layer 103" and draws heat away from the coupled heat generation device (see FIG. 1A, heat generation device 104). As particularly shown in FIG. 2C, each of the dimples 202 of the porous layer 103" may have at least two pores 204 therein to maximize fluid flow through each of the dimples 202.

While the dimples 202 depicted in FIG. 2C appear generally spherical in shape, this is merely illustrative. That is, the dimples 202 may be any shape (including irregular shapes). The shape of the dimples 202 may be determined from the shape of the materials used to form the porous layer 103", as described in greater detail herein.

A thickness t of the porous layer 103, 103', 103" is not limited by the present disclosure, and may generally be any thickness. In some embodiments, the thickness t of the porous layer 103, 103', 103" may be such that a space is maintained within the hollow interior of a cooling device structure (see e.g., FIG. 1A, structure 107 of cooling device 102 is not entirely filled). In other embodiments, the thickness t of the porous layer 103, 103', 103" may be such that the porous layer 103, 103', 103" fills an entire hollow interior of the cooling device structure (not shown, e.g., structure 107 of cooling device 102 entirely filled).

The porous layer 103" of FIG. 2C may generally be constructed of a material 206 (e.g., a thermally conductive material or the like), but is otherwise not limited by the present disclosure. In some embodiments, the material 206 used for the porous layer 103" may be selected based on the process used to form the porous layer 103", as described in greater detail herein. For example, if the porous layer 103" is formed via an MIO formation process, metals that are suitable for such a formation process may be used. Illustrative examples of materials that may be used include, but are not limited to, aluminum, nickel, copper, silver, gold, an alloy containing any of the foregoing, a compound containing any of the foregoing, and the like. Other materials that are generally understood to result from an inverse opal formation process that are not specifically disclosed herein are also included within the scope of the present disclosure.

The various stages, illustrated in FIGS. 2A-2C, during formation of the porous layer 103" including an inverse opal structure (e.g., MIO) is now described. It should be understood that other processes to achieve the porous layer 103" may also be used without departing from the scope of the present disclosure.

Referring to FIG. 2A, an opal structure 208 may be positioned within a cooling device 210 (see FIG. 1A, e.g., similar to the hollow interior of cooling device 102). More particularly, the opal structure 208 may be positioned on an interior surface 212 of the cooling device 210 in a location where a porous layer 103" is desired (see FIG. 1A, e.g., surface 105 of cooling device 102 that will interface with surface 109 of heat generation device 104). According to alternative embodiments, the opal structure may be positioned on and formed (as described herein) directly on the surface 109 of the heat generation device 104. In light of FIG. 2A, the opal structure 208 may generally be a lattice of material (e.g., a mesh) that is shaped, sized, and configured to form the dimples 202, pores 204, and/or other surface features of the porous layer 103" in the negative space that remains after removal of the opal structure 208, as described herein. Accordingly, the opal structure 208 may generally be constructed of a material 214 that can later be dissolved, etched, or otherwise removed without altering the shape of the dimples 202, pores 204, and/or other surface features, as described herein. In some embodiments, the opal structure 208 may be a polymer material, such as, for example, a polystyrene opal structure. In some embodiments, the opal structure 208 may be provided as a film, such as a polystyrene opal film. In other embodiments, the opal structure 208 may be a self-assembled opal structure.

Several methods of constructing the opal structure 208 are possible. One illustrative method to synthesize the opal structure 208 is via a controlled withdrawal process whereby a colloidal suspension of spheres is provided within the cooling device 210, a substrate is inserted into the suspension in order to create a meniscus line within the cooling device 210, and the suspending agent (e.g., water) is slowly evaporated. In such an aspect, the surface tension of the evaporating suspending agent at the top of the meniscus line pulls the spheres into a closely packed array no more than a few layers thick, leaving the opal structure 208 of spheres within the cooling device 210. This opal structure 208 of spheres, as depicted in FIG. 2A, is arranged such that plurality of voids 216 are present around each of the spheres of the opal structure 208. The voids 216 receive material 206 that is used to form the porous layer (FIG. 2C), as described hereinbelow.

Referring now to FIG. 2B, material 206 may be deposited over the opal structure 208 and the interior surface 212 of the cooling device 210. The material 206 may generally be deposited such that the material 206 fills the voids 216 (FIG. 2A) around the spheres of the opal structure 208. The material 206 that is deposited is generally the material 206 that results in the porous layer 103" described herein. That is, the material 206 may be aluminum, nickel, copper, silver, gold, an alloy containing any of the foregoing, a compound containing any of the foregoing, and the like. Additional materials may also be used without departing from the scope of the present disclosure.

Still referring to FIG. 2B, the material 206 may be deposited via any generally recognized method of deposition, such as, for example, chemical vapor deposition (CVD), electrodeposition, epitaxy, and thermal oxidation. In some embodiments, physical vapor deposition (PVD) or casting may also be used to deposit the material 206. It should be understood that the deposition process may or does not completely fill the interstitial spaces (e.g., the voids 216), but rather creates a layer of material around the spheres such that, when the spheres are removed, the dimples 202, pores 204, and/or other surface features of the porous layer 103" are formed.

Referring to FIGS. 2B-2C, the opal structure 208 may be removed such that the material 206 formed around the opal structure 208 remains as the porous layer 103" having the dimples 202, pores 204, and/or other surface features. More particularly, removal of the spheres of the opal structure 208 defines the dimples 202 and locations where the spheres were in contact define the pores 204. Removal of the opal structure 208 may generally be completed via any removal processes, particularly removal processes that are suitable for removing the material 214 used for the opal structure 208 (e.g., polystyrene material) but not the material 206 that defines the porous layer 103". For example, an etching process may be used to remove the material 214 of the opal structure 208. That is, an etchant may be applied to the opal structure 208 and the material 206 (e.g., by placing the opal structure 208 and the material 206 in an etchant bath) to etch away the material 214 opal structure 208. In some embodiments, a hydrofluoric acid solution may be used as an etchant to etch away the opal structure 208. Other methods that cause the opal structure 208 to be removed or otherwise dissolved should generally be understood. As a result of this process, the porous layer 103" (FIG. 2C) is formed on the interior surface 212 of the cooling device 210.

Figure 3:
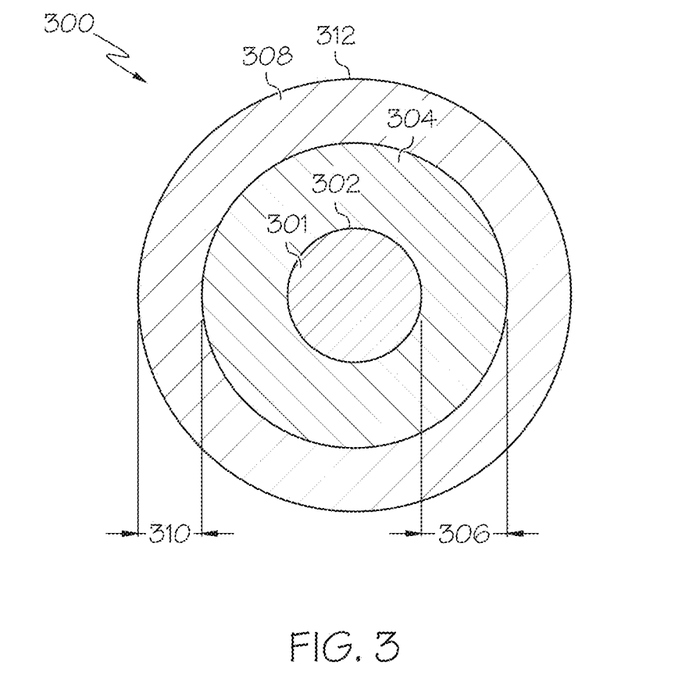
FIG. 3 depicts an illustration of a cross-section of an encapsulated phase change porous layer according to one or more embodiments shown and described herein.

Within this backdrop, regardless of the process through which the porous layer 103, 103', 103" has been formed (e.g., a sintering process, a MIO process, and/or the like), FIG. 3 illustrates a cross-section of an encapsulated phase change porous layer 300 formed, as described herein (see FIG. 4), using a porous layer (e.g., 103, 103', 103"). According to various embodiments, the porous layer 103, as depicted in FIG. 1A, may be substituted with the encapsulated phase change porous layer 300 formed as described herein (see FIG. 4).

FIG. 3, according to various aspects, depicts a cross-section of metal 301 including a metal surface 302 as defined by a porous layer (e.g., porous layer 103' of FIG. 1B, porous layer 103" of FIG. 2C, and/or the like). For example, the cross section of metal 301 depicted in FIG. 3 may be a cross-section of the material 112 (e.g., metal) specifically referenced in FIG. 1B or a cross-section of the material 206 (e.g., metal) specifically reference in FIG. 2C.

As illustrated in FIG. 3, according to various aspects, the various components (e.g., metal 301, phase change material 304, encapsulation material 308) may have a circular cross-section. According to other aspects, the various components (e.g., metal 301, phase change material 304, encapsulation material 308) may have a cross-section other than a circular cross-section (e.g., a square cross-section, a variable cross-section). The cross-section of the various components is not limited in the present disclosure.

As previously highlighted, the metal surface 302 of the overall porous layer (e.g. porous layer 103' of FIG. 1B, porous layer 103" of FIG. 2C, and/or the like), if utilized alone, may exhibit a limited or reduced heat capacity for dissipating heat from a heat generation device coupled thereto. As such, according to embodiments described herein, an encapsulated phase change porous layer 300 including a phase change material 304 and an encapsulation material 308 is disclosed. In particular, to form the encapsulated phase change porous layer 300, a phase change material 304 may be formed (e.g., coated, layered, deposited, and/or the like) on the metal surface 302. The phase change material 304 may be formed on the metal surface 302 via any deposition method now known or later developed, particularly deposition methods that are suited for the materials used. In some embodiments, the phase change material 304 may be deposited on the metal surface 302 via atomic layer deposition (ALD), chemical vapor deposition (CVD) processes, and/or the like.

According to various aspects, the phase change material 304 may include tin (Sn), indium (In), paraffin wax (e.g., $C_nH_{2n+2}$) and/or the like. In view of FIG. 3, the phase change material 304 may be formed on the metal surface 302 (e.g., exposed surfaces) to a thickness 306 (e.g., a phase change material thickness, a first thickness, a predetermined thickness and/or the like). According to various aspects, the thickness 306 of the phase change material 304 may be uniform or non-uniform. According to some aspects the thickness 306 of the phase change material may be a function of the thermal energy that the encapsulated phase change porous layer 300 is anticipated or intended to store. According to further aspects, the phase change material 304 may not cover the entire metal surface 302 (e.g., the phase change material 304 may cover a partial portion of the circumference of the metal surface 302 if the metal surface 302 has a circular cross-section, the phase change material 304 may cover a partial portion of the metal surface 302 if the metal surface 302 does not have a circular cross-section, and/or the like).

As illustrated in FIG. 3, an encapsulation material 308 may be formed (e.g., coated, layered, deposited, and/or the like) on the phase change material 304 to encapsulate the phase change material 304 between the encapsulation material 308 and the metal surface 302. The encapsulation material 308 may be formed on the phase change material 304 via any deposition method now known or later developed, particularly deposition methods that are suited for the materials used. In some embodiments, the encapsulation material 308 may be deposited on the phase change material via atomic layer deposition (ALD), chemical vapor deposition (CVD) processes, and/or the like.

According to various aspects, the encapsulation material 308 may include platinum (Pt), copper (Cu), aluminum (Al) and/or the like. In view of FIG. 3, the encapsulation material 308 may be formed on the phase change material 304 to a thickness 310 (e.g., an encapsulation material thickness, a second thickness, a predetermined thickness, and/or the like). According to various aspects the thickness of the encapsulation material may be uniform or non-uniform. According to some aspects, the thickness 310 of the encapsulation material 308 may be a function of the thermal expansion of the phase change material 304 during storage of the thermal energy anticipated or intended to be stored by the encapsulated phase change porous layer 300. According to further aspects, the encapsulation material 308 may not surround or encapsulate the entire metal surface 302. For example, if the phase change material 304 covers only a partial portion of the metal surface 302, as described herein, the encapsulation material 308 may only surround or encapsulate the phase change material 304 that covers the partial portion of the metal surface 302 (e.g., thereby encapsulating the phase change material 304 between the encapsulation material 308 and the metal surface 302). According to alternative aspects, the encapsulation material 308 may surround the entire metal surface 302 regardless of whether the phase change material 304 covers a partial portion of the metal surface 302 (e.g., the encapsulation material 308 may not only encapsulate the phase change material 304 between the encapsulation material 308 and the metal surface 302 but also encapsulate a portion of the metal surface not covered by the phase change material).

Viewing FIG. 3 in light of FIGS. 1B and 2C, a combined thickness (e.g., thickness 306 of the phase change material 304 and thickness 310 of the encapsulation material 308) may further be a function of the size, shape, density and/or distribution of the network of voids or pores (see FIG. 1B—pores 114, FIG. 2C—dimples 202 and pores 204, and/or the like) of the porous layer (e.g. porous layer 103' of FIG. 1B, porous layer 103" of FIG. 2C, and/or the like). According to various aspects, the combined thickness (e.g., thickness 306 of the phase change material 304 and thickness 310 of the encapsulation material 308) would not substantially inhibit the fluid communication of a cooling fluid (e.g., liquid and/or gas) through the encapsulated phase change porous layer 300 and/or substantially plug or eliminate sites for the nucleation of a cooling liquid (e.g., from a liquid to a gas) within the encapsulated phase change porous layer 300. According to such aspects, the flow of the cooling fluid (e.g., active heat management) and/or the nucleation of the cooling liquid (e.g., passive heat management) further enhance the ability of the encapsulated phase change porous layer 300 to dissipate heat from the heat generation device. More specifically, such a flow of a cooling fluid and/or such a nucleation of a cooling liquid may draw thermal energy being stored by the phase change material 304 away from the phase change material 304 through the encapsulation material. According to such aspects, the phase change material 304 is able to absorb further thermal energy (e.g., see FIG. 1B—via material 112 of porous layer 103', see FIG. 2B—via material 206 of porous layer 103") from a heat generating device coupled thereto.

Referring again to FIG. 3, according to various aspects, the phase change material 304 may have a melting temperature substantially equal to a normal operating temperature of a heat generation device to which the encapsulated phase change porous layer 300 is to be coupled (see FIG. 1A). According to other aspects, the phase change material 304 may have a melting temperature substantially equal to an expected operating temperature of the heat generation device. According to further aspects, the phase change material 304 may have a melting temperature substantially equal to a predefined operating temperature of the heat generation device.

Further, referring to FIG. 3, according to various aspects, the encapsulation material 308 may have a melting temperature higher than that of the phase change material 304. According to other aspects, the encapsulation material 308 may have a melting temperature higher than that of the phase change material 304 and up to a maximum operating temperature of the heat generation device. According to further aspects, the encapsulation material 308 may have a melting temperature higher than that of the phase change material 304 and equal to or higher than the maximum operating temperature of the heat generation device. According to such aspects, since the encapsulation material 308 has a melting temperature higher than the phase change material 304 and either up to, equal to or higher than the maximum operating temperature of the heat generation device, the encapsulation material 308 is able to retain the phase change material 304 (e.g., in a melted, thermally storing phase) between the encapsulation material 308 and the metal surface 302 of the encapsulated phase change porous layer 300.

In light of FIG. 3, according to various aspects described herein, when the heat generation device (e.g., semi-conductor chip and/or the like) operates at a temperature lower than the melting temperature associated with the phase change material 304 heat flux may be conducted from the heat generation device, through the metal 301 of the porous layer (e.g., see FIG. 1B—through material 112 of porous layer 103', see FIG. 2B—through material 206 of porous layer 103"), through the phase change material 304, and through the encapsulation material 308. Notably, in such an aspect, the phase change material 304 does not change phase. Further, in such an aspect, a cooling fluid (e.g., liquid and/or gas) flowing over the external surface 312 of the encapsulation material 308 and/or a cooling liquid boiling off of the external surface 312 of the encapsulation material 308 may transfer heat away from the encapsulated phase change porous layer 300 thereby effectively cooling a system including the encapsulated phase change porous layer 300 and the heat generation device coupled thereto.

According to further aspects described herein, when the heat generation device (e.g., semi-conductor chip and/or the like) operates at a temperature higher than the melting temperature associated with the phase change material 304 heat flux may similarly be conducted from the heat generation device, through the metal 301 of the porous layer (e.g., see FIG. 1B—through material 112 of porous layer 103', see FIG. 2B—through material 206 of porous layer 103"), through the phase change material 304, and through the encapsulation material 308 as described. However, in such an aspect, the phase change material 304 may absorb additional thermal energy by changing phase from a solid to a liquid when its temperature increases above the melting temperature of the phase change material 304. Further, in such an aspect, a cooling fluid (e.g., liquid and/or gas) flowing over the external surface 312 of the encapsulation material 308 and/or a cooling liquid boiling off of the external surface 312 of the encapsulation material 308 may similarly transfer heat away from the encapsulated phase change porous layer 300 thereby effectively cooling a system including the encapsulated phase change porous layer 300 and the heat generation device coupled thereto. Notably, in such an aspect, the phase change of the encapsulated phase change material enables the encapsulated phase change porous layer 300 to absorb more thermal energy relative to a porous layer not including the phase change material 304 and/or the encapsulation material 308.

Further, according to such an aspect, the cooling fluid flowing over the external surface 312 of the encapsulation material 308 and/or the cooling liquid boiling off of the external surface 312 of the encapsulation material 308 may effectively draw heat away from the phase change material 304 such that the phase change material 304 is able to absorb or draw further thermal energy from the heat generation device. Notably, in such aspects, since the melting temperature of the encapsulation material 308 is higher than the melting temperature of the phase change material 304 and either up to, equal to, or higher than the maximum operating temperature of the heat generation device, the encapsulation material 308 does not melt and the phase change material 304 (e.g., in the liquid phase) is prevented from mixing with the cooling fluid and/or the cooling liquid.

Accordingly, in view of FIG. 3, since the phase change material 304 is unable to escape its position between the metal 301 of the porous layer (e.g., see FIG. 1B—material 112 of porous layer 103', see FIG. 2B—material 206 of porous layer 103") and the encapsulation material 308, the phase change material 304 may start to return from a liquid phase to a solid phase after a temperature of the heat generation device drops below the melting temperature of the phase change material 304. According to various aspects, such a configuration enables repeated cycles of heating and cooling of the encapsulated phase change porous layer 300 as needed or on demand to dissipate heat from the heat generation device.

Figure 4:
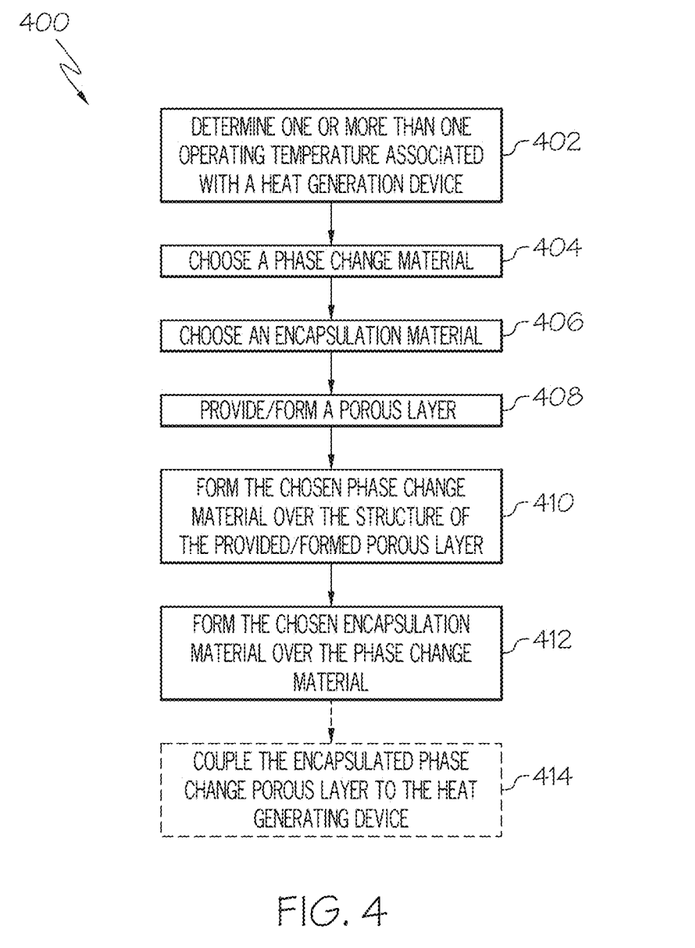
FIG. 4 depicts a flow diagram of an illustrative method of forming an encapsulated phase change porous layer according to one or more embodiments shown and described herein.

FIG. 4 depicts a flow diagram 400 of an illustrative method of forming an encapsulated phase change porous layer (see FIG. 3, e.g., encapsulated phase change porous layer 300) according to one or more embodiments described herein. At block 402, the method may include determining one or more than one operating temperature associated with a heat generation device. According to aspects described herein, the heat generation device is to be thermally coupled to the encapsulated phase change porous layer. According to some aspects, determining the one or more than one operating temperature may include determining a normal operating temperature. The normal operating temperature may be calculated based on standard operating conditions. According to other aspects, determining the one or more than one operating temperature may include determining an expected operating temperature. The expected operating temperature may be calculated based on anticipated operating conditions. According to further aspects, determining the one or more than one operating temperature may include determining a predefined operating temperature. The predefined operating temperature may be a temperature of the heat generation device at which the heat generation device efficiently performs its operations. According to yet further aspects, determining the one or more than one operating temperature may include determining a maximum operating temperature. The maximum operating temperature may be calculated based on a worst-case set of operating conditions. According to other aspects, the maximum operating temperature may be a temperature at which the heat generation device may fail or has been tested to fail.

At block 404, the method may further include choosing a phase change material. According to some aspects described herein, choosing the phase change material may include choosing a phase change material having a melting temperature equal to or higher than a normal operating temperature of the heat generation device (e.g., determined at block 402). According to such aspects, choosing the phase change material may include choosing a phase change material having a melting temperature equal to or higher than the normal operating temperature of the heat generation device and less than the maximum operating temperature of the heat generation device. According to other aspects, choosing the phase change material may include choosing a phase change material having a melting temperature equal to or higher than an expected operating temperature of the heat generation device (e.g., determined at block 402). According to such aspects, choosing the phase change material may include choosing a phase change material having a melting temperature equal to or higher than the expected operating temperature of the heat generation device and less than the maximum operating temperature of the heat generation device. According to further aspects, choosing the phase change material may include choosing a phase change material having a melting temperature equal to or higher than a predefined operating temperature of the heat generation device (e.g., determined at block 402). According to such aspects, choosing the phase change material may include choosing a phase change material having a melting temperature equal to or higher than the predefined operating temperature of the heat generation device and less than the maximum operating temperature of the heat generation device.

At block 406, the method may further include choosing an encapsulation material. According to some aspects described herein, choosing the encapsulation material may include choosing an encapsulation material having a melting temperature higher than the melting temperature associated with the phase change material (e.g., chosen at block 404). According to other aspects, choosing the encapsulation material may include choosing an encapsulation material having a melting temperature higher than the melting temperature associated with the phase change material (e.g., chosen at block 404) and up to the maximum operating temperature of the heat generation device. According to further aspects, choosing the encapsulation material may include choosing an encapsulation material having a melting temperature higher than the melting temperature associated with the phase change material (e.g., chosen at block 404) and equal to or higher than the maximum operating temperature of the heat generation device.

At block 408, the method may further include providing or forming a porous layer. According to various aspects, the porous layer may be pre-existing (e.g., already formed). According to further aspects described herein, the porous layer may be formed via a sintering process. According to alternative aspects, the porous layer may be formed via a process other than a sintering process (e.g., MIO, CIO, NIO, and/or the like).

At block 410, the method may further include forming (e.g., coating, layering or depositing) the phase change material (e.g., chosen at block 404) over the structure or material (e.g., metal) of the porous layer (e.g., formed at block 408). According to various aspects, as discussed in FIG. 3 above, the phase change material over the structure or material of the porous layer may include forming the phase change material to a first thickness or a predetermined thickness.

At block 412, the method may further include forming (e.g., coating, layering or depositing) the encapsulation material (e.g., chosen at block 406) over the phase change material (e.g., chosen at block 404). According to various aspects, forming the encapsulation material over the phase change material may include forming the encapsulation material to encapsulate the phase change material between the encapsulation material and the structure and/or material of the porous layer. According to further aspects, the encapsulation material may be formed over the phase change material to retain the phase change material between the encapsulation material and the porous layer when a fluid (e.g., cooling fluid) is flowed through and/or in contact with the encapsulated phase change porous layer. According to various aspects, as discussed in FIG. 3 above, forming the encapsulation material over the phase change material may include forming the encapsulation material to a second thickness or a predetermined thickness.

At block 414, once the encapsulated phase change porous layer has been formed (e.g., via block 402-412 described above). The method may optionally include (e.g., shown in phantom) coupling the formed encapsulated phase change porous layer to the heat generating device (e.g., associated with the operating temperatures determined at block 402). According to various aspects, coupling the formed encapsulated phase change porous layer to the heat generating device may include coupling a cooling device, including the encapsulated phase change porous layer, to the heat generating device (see FIG. 1A).

According to various alternative embodiments, more than one phase change material may be encapsulated within a provided or formed porous layer. For example, a first phase change material may be encapsulated in a first portion of a porous layer (e.g., one side, one half, and/or the like) and a second phase change material may be encapsulated in a second portion of a porous layer (e.g., other side, other half, and/or the like). According to yet further alternative embodiments, a phase change material may be encapsulated on only a portion of a porous layer (e.g., one side, one half, and/or the like) and a remaining portion of the porous layer may not have a phase change material encapsulated thereon (e.g., other side, other half, and/or the like).

It should now be understood that the systems and methods described herein are suitable for producing a porous layer exhibiting an enhanced heat capacity. More specifically, encapsulating a phase change material between an encapsulation material and a metal of a porous layer (wherein the phase change material and the encapsulation material have been chosen based on operating temperatures associated with a heat generation device) produces an encapsulated phase change porous layer capable of absorbing increase thermal energy from the heat generation device relative to a porous layer not including a phase change material and/or encapsulation material.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A heat transfer system, comprising:
   an encapsulated phase change porous layer, comprising:
      a porous layer defined by a structure through which fluids are flowable;
      a phase change material formed over the structure of the porous layer, the phase change material comprising tin, indium, or paraffin wax; and
      an encapsulation material formed over the phase change material such that the encapsulation material encapsulates the phase change material between the encapsulation material and the structure of the porous layer and retains the phase change material between the encapsulation material and the structure of the porous layer when a fluid is flowed through the porous layer.

2. The heat transfer system of claim 1, wherein the structure of the porous layer includes a network of pores that vary in at least one of size, shape, density, or distribution.

3. The heat transfer system of claim 1, wherein the structure of the porous layer includes a metal inverse opal structure having a plurality of dimples and a plurality of pores.

4. The heat transfer system of claim 3, wherein the plurality of pores permit the fluids to flow through the plurality of dimples.

5. The heat transfer system of claim 3, wherein each of the plurality of dimples are spherical in shape.

6. The heat transfer system of claim 1, wherein:
the structure of the porous layer is defined by a porous layer material, the porous layer material comprising one of aluminum, nickel, copper, silver or gold; and
the encapsulation material comprises one of copper or aluminum.

7. The heat transfer system of claim 1, wherein the phase change material is formed over the structure of the porous layer to a first thickness.

8. The heat transfer system of claim 7, wherein the encapsulation material is formed over the phase change material to a second thickness.

9. A heat transfer system, comprising:
a heat generation device; and
a cooling device coupled to the heat generation device, wherein the cooling device comprises an encapsulated phase change porous layer, comprising:
  a porous layer defined by a metal inverse opal (MIO) structure through which fluids are flowable;
  a phase change material formed over the MIO structure, the phase change material comprising tin, indium, or paraffin wax; and
  an encapsulation material formed over the phase change material such that the encapsulation material encapsulates the phase change material between the encapsulation material and the MIO structure and retains the phase change material between the encapsulation material and the MIO structure when a fluid is flowed through the porous layer.

10. The heat transfer system of claim 9, wherein the MIO structure comprises a plurality of dimples and a plurality of pores.

11. The heat transfer system of claim 10, wherein the plurality of pores permit the fluids to flow through the plurality of dimples.

12. The heat transfer system of claim 10, wherein each of the plurality of dimples are spherical in shape.

13. The heat transfer system of claim 9, wherein:
the MIO structure is defined by a material comprising one of aluminum, nickel, copper, silver or gold; and
the encapsulation material comprises one of copper or aluminum.

14. The heat transfer system of claim 9, wherein the phase change material is formed over the MIO structure to a first thickness.

15. The heat transfer system of claim 14, wherein the encapsulation material is formed over the phase change material to a second thickness.

16. A method of forming an encapsulated phase change porous layer, the method comprising:
forming a porous layer that is defined by a structure through which fluids are flowable;
forming a phase change material over the structure of the porous layer, the phase change material comprising tin, indium, or paraffin wax; and
forming an encapsulation material over the phase change material such that the encapsulation material encapsulates the phase change material between the encapsulation material and the structure of the porous layer and retains the phase change material between the encapsulation material and the structure of the porous layer when a fluid is flowed through the porous layer.

17. The method of claim 16, wherein the structure of the porous layer comprises a metal inverse opal (MIO) structure having a plurality of dimples and a plurality of pores formed via a MIO process.

18. The method of claim 17, wherein:
the MIO structure is defined by a porous layer material, the porous layer material comprising one of aluminum, nickel, copper, silver or gold; and
the encapsulation material comprises one of copper or aluminum.

19. The method of claim 16, wherein forming the phase change material over the structure of the porous layer comprises layering, depositing or coating the phase change material over the structure of the porous layer to a first thickness.

20. The method of claim 19, wherein forming the encapsulation material over the phase change material comprises layering, depositing or coating the encapsulation material over the phase change material to a second thickness.

* * * * *

UNITED STATES PATENT AND TRADEMARK OFFICE
CERTIFICATE OF CORRECTION

PATENT NO. : 11,031,318 B2
APPLICATION NO. : 16/864383
DATED : June 8, 2021
INVENTOR(S) : Shailesh N. Joshi Page 1 of 1

It is certified that error appears in the above-identified patent and that said Letters Patent is hereby corrected as shown below:

On the Title Page

In page 2, item (56), Column 2, cite no. 9, delete "Ranjari" and insert --Ranjan--, therefor.

Signed and Sealed this
Twentieth Day of July, 2021

Drew Hirshfeld
*Performing the Functions and Duties of the*
*Under Secretary of Commerce for Intellectual Property and*
*Director of the United States Patent and Trademark Office*